(12) United States Patent
Sugimoto et al.

(10) Patent No.: US 9,029,712 B2
(45) Date of Patent: May 12, 2015

(54) PRINTED CIRCUIT BOARD AND METHOD OF MANUFACTURING THE SAME

(71) Applicant: Nitto Denko Corporation, Ibaraki-shi, Osaka (JP)

(72) Inventors: Yuu Sugimoto, Ibaraki (JP); Youhei Shirafuji, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 48 days.

(21) Appl. No.: 13/828,616

(22) Filed: Mar. 14, 2013

(65) Prior Publication Data
US 2013/0284498 A1    Oct. 31, 2013

Related U.S. Application Data

(60) Provisional application No. 61/649,523, filed on May 21, 2012.

(30) Foreign Application Priority Data

Apr. 27, 2012    (JP) .................................. 2012-103931

(51) Int. Cl.
*H05K 1/03*    (2006.01)
*H05K 1/00*    (2006.01)
*H05K 1/11*    (2006.01)
*H01K 3/10*    (2006.01)
*H05K 1/02*    (2006.01)
*H05K 13/00*    (2006.01)
*H05K 1/05*    (2006.01)

(52) U.S. Cl.
CPC ............. *H05K 1/0296* (2013.01); *H05K 13/00* (2013.01); *H05K 1/0278* (2013.01); *H05K 1/056* (2013.01); *H05K 1/111* (2013.01); *H05K 2201/09063* (2013.01)

(58) Field of Classification Search
CPC ............................... H05K 1/0393; H05K 3/28
USPC ............ 174/261, 262, 254, 255, 250; 29/852
See application file for complete search history.

(56) References Cited

U.S. PATENT DOCUMENTS

| | | | |
|---|---|---|---|
| 6,399,899 B1 * | 6/2002 | Ohkawa et al. ................ | 174/261 |
| 2001/0030836 A1 | 10/2001 | Katsumata | |
| 2005/0013051 A1 | 1/2005 | Katsumata | |
| 2007/0017695 A1 * | 1/2007 | Ishii et al. ...................... | 174/255 |
| 2007/0170911 A1 * | 7/2007 | Ohsawa et al. ............ | 324/158.1 |
| 2010/0142097 A1 * | 6/2010 | Kawano ..................... | 360/245.8 |

FOREIGN PATENT DOCUMENTS

JP    2001-266511 A    9/2001

* cited by examiner

*Primary Examiner* — Timothy Thompson
*Assistant Examiner* — Sherman Ng
(74) *Attorney, Agent, or Firm* — Panitch Schwarze Belisario & Nadel LLP

(57) ABSTRACT

Read wiring traces and write wiring traces are formed on an insulating layer that is formed on a support substrate. Connection terminals that are electrically connectable to external circuits are formed at parts of the read wiring traces and write wiring traces on the insulating layer, respectively. Openings are formed in the support substrate so as to partially or entirely surround overlap regions that overlap with the connection terminals and have the same plane shape as the connection terminals. Parts of the insulating layer are exposed in the openings.

17 Claims, 12 Drawing Sheets

F I G. 6 (a)
CROSS SECTIONAL VIEW
TAKEN ALONG LINE B-B
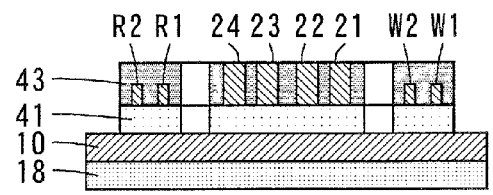
BOTTOM VIEW
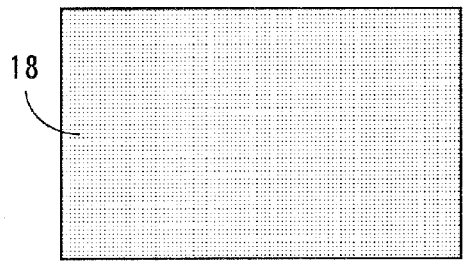
F I G. 6 (b)
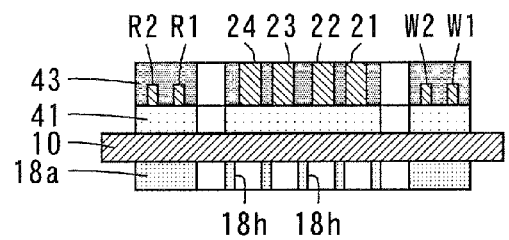
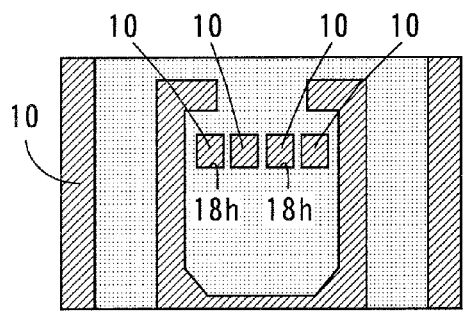
F I G. 6 (c)
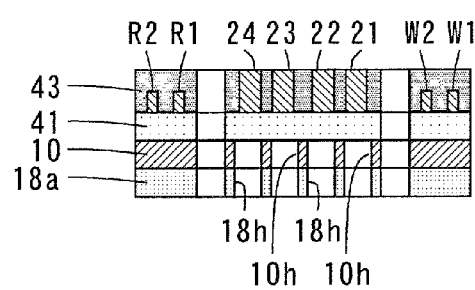
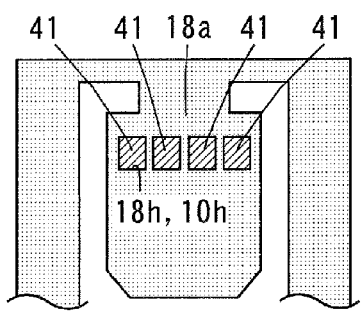
F I G. 6 (d)
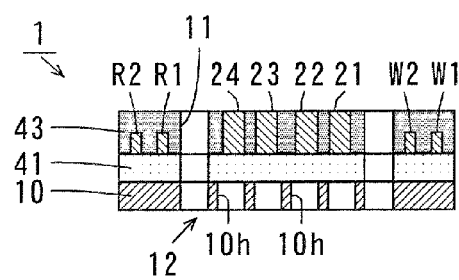
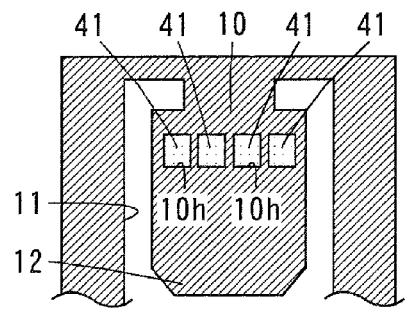

INVENTIVE EXAMPLE 1

INVENTIVE EXAMPLE 2

INVENTIVE EXAMPLE 3

INVENTIVE EXAMPLE 4

INVENTIVE EXAMPLE 5

INVENTIVE EXAMPLE 6

INVENTIVE EXAMPLE 7

INVENTIVE EXAMPLE 8

INVENTIVE EXAMPLE 9

INVENTIVE EXAMPLE 10

COMPARATIVE EXAMPLE 1

COMPARATIVE EXAMPLE 2

PRINTED CIRCUIT BOARD AND METHOD OF MANUFACTURING THE SAME

BACKGROUND OF THE INVENTION (1) Field of the Invention

The present invention relates to a printed circuit board and a method of manufacturing the printed circuit board.

(2) Description of Related Art

Actuators are used in drives such as hard disk drives. Such an actuator includes an arm provided rotatably around a rotation shaft, and a suspension board for a magnetic head that is attached to the arm. The suspension board is a printed circuit board for positioning the magnetic head at a desired track of a magnetic disk.

In JP 2001-266511 A, an HSA (Head Suspension Assembly) provided with a relay FPC (Flexible Printed Circuit Board) on a suspension with a backing board sandwiched therebetween is described. The relay FPC includes copper foil that constitutes conductive lines and insulating films that cover the upper and lower surfaces of the copper foil. A head IC (Integrated Circuit) is mounted on the copper foil of the relay FPC with solder bumps sandwiched therebetween.

In a portion where the head IC is mounted, the insulating films on the upper and lower surfaces of the copper foil are removed. Further, openings are formed in portions of the backing board and the suspension that are opposite to the head IC. Thus, in a portion where the head IC is mounted, the copper foil is exposed to the outside through the openings.

BRIEF SUMMARY OF THE INVENTION

In recent years, with miniaturization of printed circuit boards, the size of connection terminals has been reduced. In such printed circuit boards, melted solder is sprayed to the connection terminals such that electronic components are bonded to the connection terminals. However, as the HSA mentioned in JP 2001-266511 A, when heat dissipation is high at the connecting portion of the copper foil and the head IC (connection terminals), the solder is solidified before spreading on the connection terminals.

An object of the present invention is to provide a printed circuit board in which connection reliability can be improved and a method of manufacturing the printed circuit board.

(1) According to one aspect of the present invention, a printed circuit board that is electrically connectable to an external circuit includes a support substrate that is formed of conductive material, an insulating layer that is formed on the support substrate, a wiring trace that is formed on the insulating layer and a connection terminal that is formed at part of the wiring trace on the insulating layer and is electrically connectable to the external circuit, wherein the support substrate has an overlap region that overlaps with the connection terminal and has the same plane shape as the connection terminal, and an opening is formed in the support substrate so as to partially or entirely surround the overlap region of the support substrate, and part of the insulating layer is exposed in the opening.

In this printed circuit board, the wiring trace is formed on the insulating layer that is formed on the support substrate. The connection terminal that is electrically connectable to the external circuit is formed at part of the wiring trace on the insulating layer. The opening is formed in the support substrate so as to partially or entirely surround the overlap region that overlaps with the connection terminal and has the same plane shape as the connection terminal. Thus, part of the insulating layer is exposed in the opening.

In this case, because the insulating layer that overlaps with the connection terminal remains without being removed, the temperature of the connection terminal is kept by the insulating layer. Further, the opening is formed so as to partially or entirely surround the overlap region of the support substrate, whereby an amount of heat spreading from a portion of the insulating layer that overlaps with the connection terminal to the entire support substrate is reduced. Thus, heat dissipation of the connection terminal through the support substrate is suppressed. Therefore, when the melted bonding material for electrically connecting the connection terminal and the external circuit to each other is applied to the connection terminal, the bonding material is prevented from solidifying before spreading to the entire connection surface of the connection terminal due to the temperature drop. As a result, connection reliability of the connection terminal can be improved.

(2) The opening may have an outer periphery that is positioned outside of an outer periphery of the overlap region, and a distance between the outer periphery of the opening and the outer periphery of the overlap region may be not less than 5 μm.

In this case, the opening is formed such that the outer periphery of the opening is positioned not less than 5 μm apart from the outer periphery of the overlap region. Thus, an amount of heat spreading from a portion of the insulating layer that overlaps with the connection terminal to surroundings of the overlap region of the support substrate is sufficiently reduced. As a result, the temperature of the connection terminal can be sufficiently retained.

(3) The opening may be formed so as to spread to an inner region of the overlap region. In this case, heat transmission from a portion of the insulating layer that overlaps with the connection terminal to at least part of the overlap region of the support substrate is prevented. Therefore, an amount of heat dissipation from the overlap region of the support substrate to the outside is reduced. As a result, the temperature of the connection terminal can be sufficiently retained.

(4) The opening may have an inner periphery that is positioned inside of the outer periphery of the overlap region, and a width between the inner periphery of the opening and the outer periphery of the opening may be not less than 25 μm. In this case, heat transmission from a portion of the insulating layer that overlaps with the connection terminal to at least the region of the outer periphery of the overlap region of the support substrate is prevented. Thus, an amount of heat dissipation from the overlap region of the support substrate to the outside is reduced, and an amount of heat spreading from the overlap region of the support substrate to surroundings of the overlap region is sufficiently reduced. As a result, the temperature of the connection terminal can be sufficiently retained.

(5) A width between an inner periphery of the opening and an outer periphery of the opening may be not less than 40 μm. In this case, heat transmission from a portion of the insulating layer that overlaps with the connection terminal to at least the region of the outer periphery of the overlap region of the support substrate is prevented. Thus, an amount of heat dissipation from the overlap region of the support substrate to the outside is further reduced, and an amount of heat spreading from the overlap region of the support substrate to surroundings of the overlap region is more sufficiently reduced. As a result, the temperature of the connection terminal can be more efficiently retained.

(6) The opening may be formed so as to spread to an entire region of the overlap region. In this case, heat transmission from a portion of the insulating layer that overlaps with the connection terminal to the overlap region of the support substrate is prevented. Thus, an amount of heat dissipation from the overlap region of the support substrate to the outside is reduced, and heat is prevented from spreading from the overlap region of the support substrate to surroundings of the overlap region. As a result, the temperature of the connection terminal can be even more sufficiently retained.

(7) The opening may have an inner periphery that coincides with the outer periphery of the overlap region or is positioned outside of the outer periphery of the overlap region, and a distance between the outer periphery of the overlap region and the inner periphery of the opening may be not more than 50 μm. In this case, an amount of heat spreading to the entire support substrate from a portion of the insulating layer that overlaps with the connection terminal is sufficiently reduced. As a result, the temperature of the connection terminal can be sufficiently retained.

(8) A distance between the outer periphery of the overlap region and the inner periphery of the opening may be not more than 20 μm. In this case, an amount of heat spreading from a portion of the insulating layer that overlaps with the connection terminal to the entire support substrate is more sufficiently reduced. As a result, the temperature of the connection terminal can be more sufficiently retained.

(9) A width between the inner periphery of the opening and the outer periphery of the opening may be not less than 25 μm. In this case, heat transmission between the overlap region of the support substrate and its surrounding region is sufficiently cut off. Thus, an amount of heat spreading from the overlap region of the support substrate to surroundings of the overlap region is sufficiently reduced. As a result, the temperature of the connection terminal can be sufficiently retained.

(10) A width between the inner periphery of the opening and the outer periphery of the opening may be not less than 30 μm. In this case, heat transmission between the overlap region of the support substrate and its surrounding region is more sufficiently cut off. Thus, an amount of heat spreading from the overlap region of the substrate to surroundings of the overlap region is more sufficiently reduced. As a result, the temperature of the connection terminal can be more sufficiently retained.

(11) A width between the inner periphery of the opening and the outer periphery of the opening may be not less than 40 μm. In this case, heat transmission between the overlap region of the support substrate and its surrounding region is even more sufficiently cut off. Thus, an amount of heat spreading from the overlap region of the support substrate to surroundings of the overlap region is even more sufficiently reduced. As a result, the temperature of the connection terminal can be even more sufficiently retained.

(12) The opening may be formed so as to surround a portion that is not less than 50% in length of an outer periphery of the overlap region. In this case, an amount of heat spreading from a portion of the insulating layer that overlaps with the connection terminal to the entire support substrate is sufficiently reduced. As a result, the temperature of the connection terminal can be sufficiently retained.

(13) The opening may be formed so as to surround a portion that is not less than 75% in length of the outer periphery of the overlap region. In this case, an amount of heat spreading from a portion of the insulating layer that overlaps with the connection terminal to the entire support substrate is more sufficiently reduced. As a result, the temperature of the connection terminal can be more sufficiently retained.

(14) According to another aspect of the present invention, a method of manufacturing a printed circuit board that is electrically connectable to an external circuit includes the steps of preparing an insulating layer formed on a support substrate that is formed of conductive material, forming a wiring trace having a connection terminal that is electrically connectable to the external circuit on the insulating layer and forming an opening in the support substrate, wherein the support substrate has an overlap region that overlaps with the connection terminal and has the same plane shape as the connection terminal, the opening is formed in the support substrate so as to partially or entirely surround the overlap region, and part of the insulating layer is exposed in the opening.

In the method of manufacturing this printed circuit board, the wiring trace having the connection terminal that is electrically connectable to the external circuit is formed on the support substrate. The opening is formed in the support substrate so as to partially or entirely surround the overlap region that overlaps with the connection terminal and has the same plane shape as the connection terminal. Thus, part of the insulating layer is exposed in the opening.

In this case, because the portion of the insulating layer that overlaps with the connection terminal remains without being removed, the temperature of the connection terminal is kept by the insulating layer. Further, because the opening is formed so as to partially or entirely surround the overlap region of the support substrate, an amount of heat spreading from a portion of the insulating layer that overlaps with the connection terminal to the entire support substrate is reduced. Thus, heat dissipation from the connection terminal through the support substrate is suppressed. Therefore, when a melted bonding material for electrically connecting the connection terminal and the external circuit to each other is applied to the connection terminal, the bonding material is prevented from solidifying before spreading to the entire connection surface of the connection terminal due to the temperature drop. As a result, connection reliability of the connection terminal can be improved.

The present invention enables the connection reliability of the printed circuit board to be improved.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 6(a) to 6(d) are schematic views showing the manufacturing steps of the suspension board of FIG. 1;

DESCRIPTION OF THE PREFERRED EMBODIMENTS

[1] First Embodiment

A printed circuit board and a method of manufacturing the printed circuit board according to the first embodiment will be described below with reference to the drawings. A suspension board with a circuit used for an actuator in a hard disk drive (hereinafter referred to as a suspension board) will be described as the printed circuit board according to the first embodiment.

(1) Configuration of the Suspension Board

Figure 1:
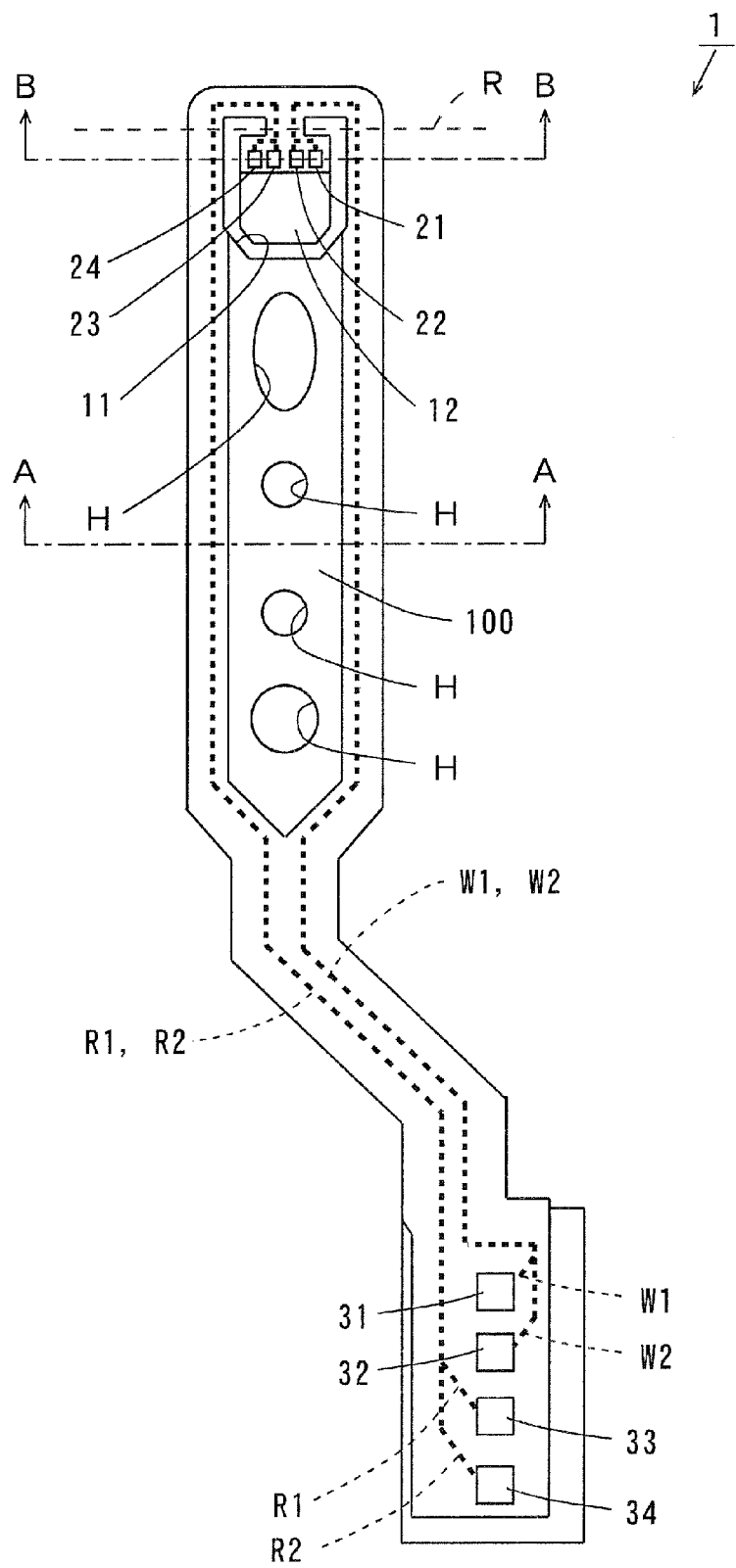
FIG. 1 is a top view of a suspension board according to a first embodiment.

FIG. 1 is a top view of the suspension board according to the first embodiment. As shown in FIG. 1, the suspension board 1 includes a suspension main body 100 formed of a long-sized support substrate made of metal. Write wiring traces W1, W2 and read wiring traces R1, R2 are formed, as indicated by thick dotted lines, on the suspension main body 100. The write wiring trace W1 and the write wiring trace W2 constitute a signal line pair. The read wiring trace R1 and the read wiring trace R2 constitute a signal line pair.

At a tip of the suspension main body 100, a magnetic head supporting portion (hereinafter referred to as a tongue) 12 is provided by forming a U-shaped opening 11. The tongue 12 is bent along a broken line R to form a predetermined angle with the suspension main body 100. Four connection terminals 21, 22, 23, 24 are formed at the tongue 12 in one end of the suspension main body 100. A head slider including the magnetic head is connected to the connection terminals 21 to 24 of the tongue 12 by solder.

Four connection terminals 31, 32, 33, 34 are formed at the other end of the suspension main body 100. An electronic component such as a preamplifier is connected to the connection terminals 31 to 34 by solder. The connection terminals 21 to 24 of the tongue 12 and the connection terminals 31 to 34 at the other end of the suspension main body 100 are electrically connected by the write wiring traces W1, W2 and the read wiring traces R1, R2, respectively. Further, a plurality of holes H are formed in the suspension main body 100.

The suspension board 1 is provided in a hard disc device. An electric current flows through the pair of the write wiring traces W1, W2 at the time of writing information into a magnetic disc. Further, the electric current flows through the pair of the read wiring traces R1, R2 at the time of reading information from the magnetic disc.

Figure 2:
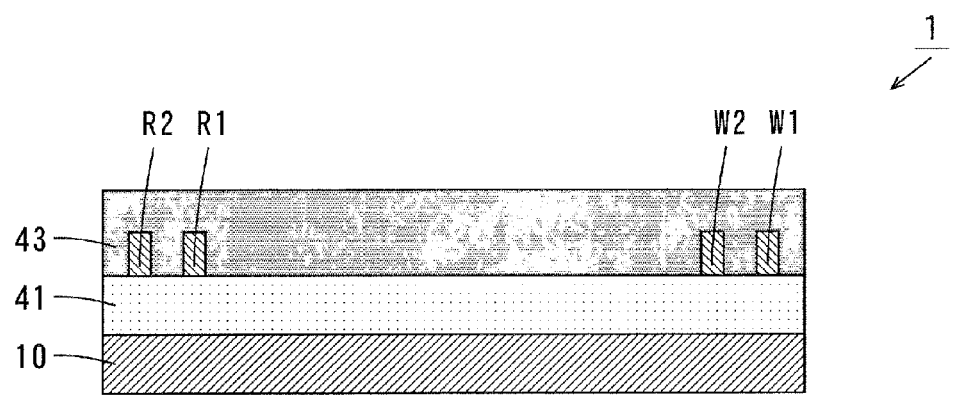
FIG. 2 is a cross sectional view taken along the line A-A of the suspension board of FIG. 1.
Figure 3:
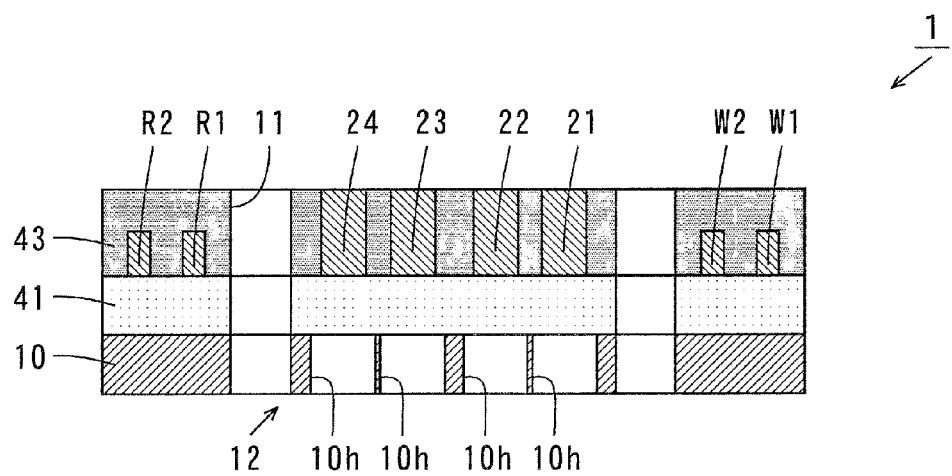
FIG. 3 is a cross sectional view taken along the line B-B of the suspension board of FIG. 1.
Figure 4:
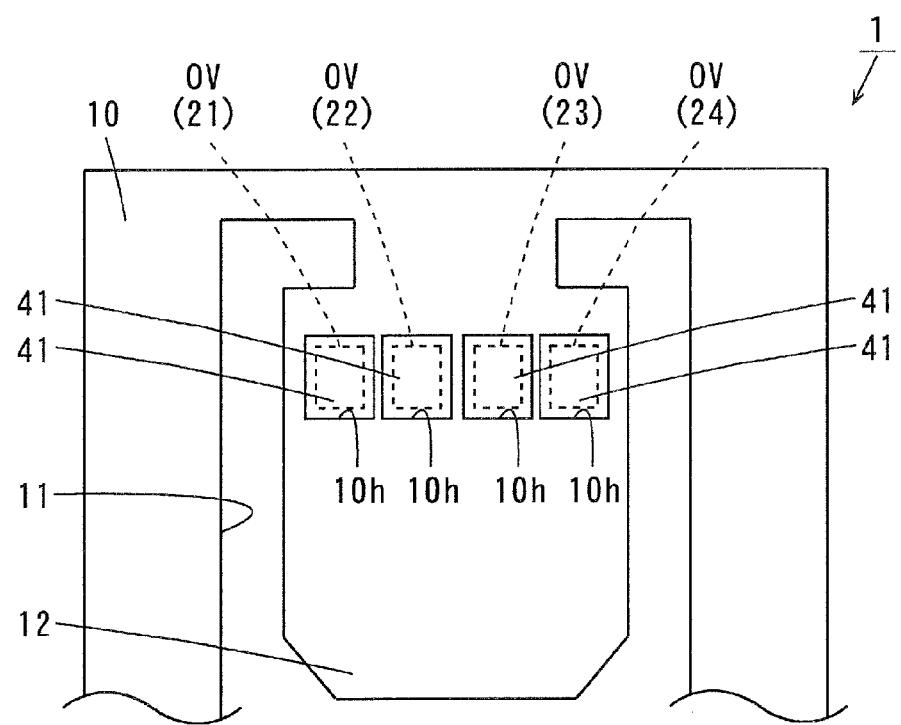
FIG. 4 is a bottom view showing a tongue of the suspension board and its peripheral portions.

Next, the connection terminals 21 to 24 of the suspension board 1 and their peripheral portions will be described in detail. FIG. 2 is a cross sectional view taken along the line A-A of the suspension board 1 of FIG. 1. FIG. 3 is a cross sectional view taken along the line B-B of the suspension board 1 of FIG. 1. FIG. 4 is a bottom view showing the tongue 12 of the suspension board 1 and its peripheral portions.

As shown in FIG. 2, an insulating layer 41 made of polyimide, for example, is formed on a metallic support substrate 10 made of stainless steel, for example. The write wiring traces W1, W2 and the read wiring traces R1, R2 are spaced apart from and parallel to each other on the insulating layer 41. The write wiring traces W1, W2 extend along one lateral side of the insulating layer 41 and the read wiring traces R1, R2 extend along the other lateral side of the insulating layer 41. A cover layer 43 made of polyimide, for example, is formed on the insulating layer 41 to cover the write wiring traces W1, W2 and the read wiring traces R1, R2.

The write wiring traces W1, W2 and the read wiring traces R1, R2 that extend along the one lateral side and the other lateral side of the insulating layer 41 are bent inward at one end of the suspension main body 100 of FIG. 1, and are further bent towards the tongue 12, and then extend to the tongue 12 as shown in FIG. 3. The write wiring traces W1, W2 and the read wiring traces R1, R2 on the tongue 12 are respectively connected to the connection terminals 21 to 24 of the tongue 12.

As shown in FIGS. 3 and 4, regions OV of the support substrate 10 that overlap with the plurality of connection terminals 21 to 24 (hereinafter referred to as overlap regions OV) and their surrounding regions of the support substrate 10 are removed. Thus, a plurality of openings 10h are respectively formed in the overlap regions OV and their surrounding regions of the support substrate 10 that correspond to the plurality of connection terminals 21 to 24. Parts of the insulating layer 41 are exposed in the openings 10h.

Each overlap region OV has the same plane-shape and the area as the connection terminals 21 to 24. In the present embodiment, the connection terminals 21 to 24 are rectangular, and each overlap region OV is also rectangular. An outer periphery of each opening 10h is positioned outside of an outer periphery of the overlap region OV.

(2) Method of Manufacturing the Suspension Board

Figure 5:
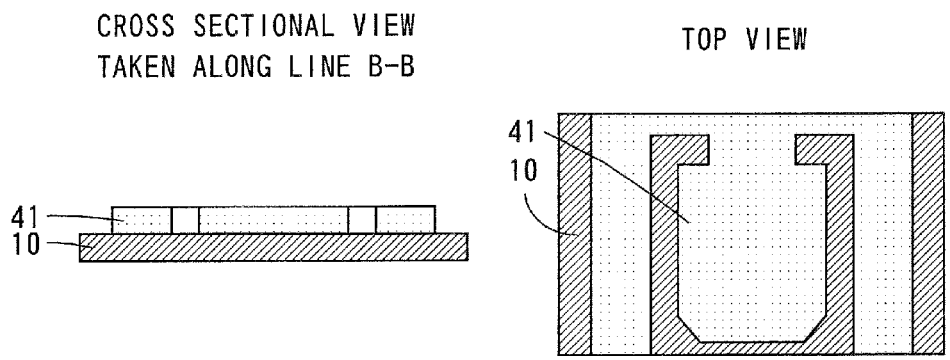
FIGS. 5(a) to 5(c) are schematic views showing manufacturing steps of the suspension board of FIG. 1.
Figure 5:
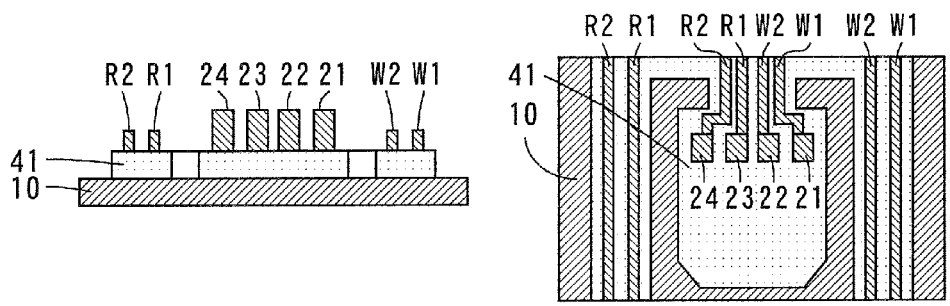
Figure 5:
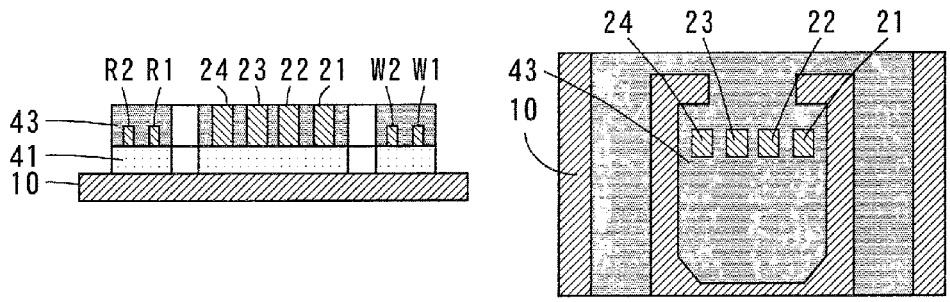

A method of manufacturing the suspension board 1 of FIG. 1 will be described below. FIGS. 5(a) to 5(c) and 6(a) to 6(d) are schematic diagrams showing the steps of manufacturing the suspension board 1 of FIG. 1. In FIGS. 5(a) to 5(c), cross sectional views taken along the line B-B of the suspension board 1 are shown in the left, and top views of the tongue 12 of the suspension board 1 of FIG. 1 and its periphery are shown in the right. In FIGS. 6(a) to 6(d), cross sectional views taken along the line B-B of the suspension board 1 of FIG. 1 are shown in the left, and bottom views of the tongue 12 and its periphery of the suspension board 1 of FIG. 1 are shown in the right. The same hatched and dotted patterns applied to each member of the cross sectional views are applied to the members of the top views of FIGS. 5(a) to 5(c) and the bottom views of FIGS. 6(a) to 6(d) in order to facilitate understanding of the configuration.

First, as shown in FIG. 5(a), the insulating layer 41 made of polyimide is formed on the support substrate 10 made of stainless steel. The thickness of the support substrate 10 is not less than 10 μm and not more than 50 μm, for example. The thickness of the insulating layer 41 is not less than 5 μm and not more than 15 μm, for example. Here, the insulating layer 41 is formed in the same shape as the suspension board 1 of FIG. 1.

Next, as shown in FIG. 5(b), the write wiring traces W1, W2 and the read wiring traces R1, R2 having predetermined patterns and the connection terminals 21 to 24 are formed on the insulating layer 41. The thickness of each write wiring trace W1, W2 and each read wiring trace R1, R2 are not less than 2 μm and not more than 18 μm, for example. Further, the width of each write wiring trace W1, W2 and each read wiring trace R1, R2 are not less than 8 μm and not more than 50 μm, for example. Moreover, the distance between the write wiring traces W1, W2 and the distance between the read wiring traces R1, R2 are not less than 8 μm nor more than 100 μm, respectively, for example. The thickness of each connection terminal 21 to 24 is not less than 2.5 μm and not more than 20 μm, for example. The width of each connection terminal 21 to 24 is not less than 10 μm and not more than 200 μm, for example.

Next, as shown in FIG. 5(c), a cover layer 43 made of polyimide is formed on the insulating layer 41 to cover the write wiring traces W1, W2 and the read wiring traces R1, R2. The connection terminals 21 to 24 are exposed from the cover layer 43. The thickness of the cover layer 43 is not less than 1 μm and not more than 10 μm, for example.

Then, as shown in FIG. 6(a), a resist film 18 is formed using a photosensitive dry film resist or the like, for example, on the lower surface of the support substrate 10. Next, as shown in FIG. 6(b), the resist film 18 is exposed in a predetermined pattern, and then developed using a development liquid such as sodium carbonate, whereby an etching resist 18a is formed. Here, a plurality of openings 18h are formed in the etching resist 18a such that the overlap regions OV of FIG. 4 and their surrounding regions of the support substrate 10 are exposed. The remaining portion of the etching resist 18a are formed into the same shape as the suspension board 1 of FIG. 1.

Thereafter, as shown in FIG. 6(c), the support substrate 10 is etched using a ferric chloride solution and a cupric chloride solution as an etching solution, whereby the plurality of openings 10h are formed in the support substrate 10 to overlap with the plurality of openings 18h. Parts of the insulating layer 41 are exposed in the plurality of openings 10h, 18h. Finally, the etching resist 18a is removed such that the suspension board 1 is completed as shown in FIG. 6(d).

(3) Effects

Figure 7:
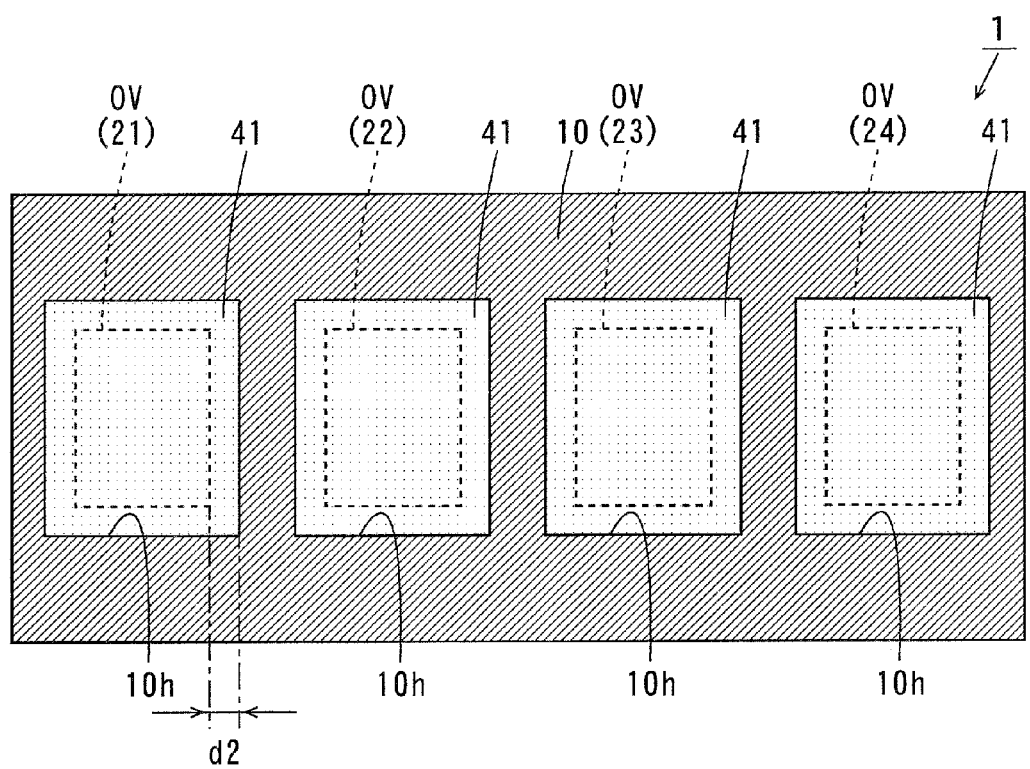
FIG. 7 is an enlarged bottom view showing connection terminals of the suspension board and their peripheral portions according to the first embodiment.

FIG. 7 is an enlarged bottom view showing the connection terminals 21 to 24 of the suspension board 1 and their peripheral portions according to the first embodiment. The same hatched and dotted patterns applied to each member of the cross sectional views of FIGS. 5(a) to 5(c) and 6(a) to 6(d) are applied to the suspension board 1 of FIG. 7 in order to facilitate understanding of the configuration.

As shown in FIG. 7, in the suspension board 1 according to the present embodiment, the insulating layer 41 that overlaps with the connection terminals 21 to 24 remains without being removed, so that the temperature of each connection terminal 21 to 24 is retained by the insulating layer 41. Further, each opening 10h is formed to surround each entire overlap region OV of the support substrate 10 and spread to the entire region of the overlap region OV, whereby heat transmission from the portions of the insulating layer 41 that overlap with the connection terminals 21 to 24 to the overlap regions OV of the support substrate 10 is prevented.

Thus, heat dissipation from the overlap regions OV of the support substrate 10 to outside is prevented, and heat is prevented from spreading from the overlap regions OV of the support substrate 10 to surroundings of the overlap regions OV. Therefore, when melted solder for electrically connecting the connection terminals 21 to 24 and a head slider including a magnetic head is applied to the connection terminals 21 to 24, the solder is prevented from solidifying before spreading to the entire connection surfaces of the connection terminals 21 to 24 due to the temperature drop. As a result, connection reliability of the connection terminals 21 to 24 can be improved.

Further, in the present embodiment, the outer periphery of each opening 10h is positioned outside of the outer periphery of each overlap region OV. A distance d2 between the outer periphery of the overlap region OV and the outer periphery of the opening 10h (hereinafter referred to as an outer peripheral offset d2) is preferably not less than 5 μm. In this case, an amount of heat that spreads from the portions of the insulating layer 41 that overlap with the connection terminals 21 to 24 to surroundings of the overlap regions OV of the support substrate 10 is sufficiently reduced. The outer peripheral offset d2 is preferably not less than 20 μm and more preferably not less than 25 μm.

The outer peripheral offset d2 is preferably not more than 60 μm. This causes the insulating layer 41 to be reinforced by the support substrate 10 and characteristic impedance of the read wiring traces R1, R2 and the write wiring traces W1, W2 to be reduced.

[2] Second Embodiment

Figure 8:
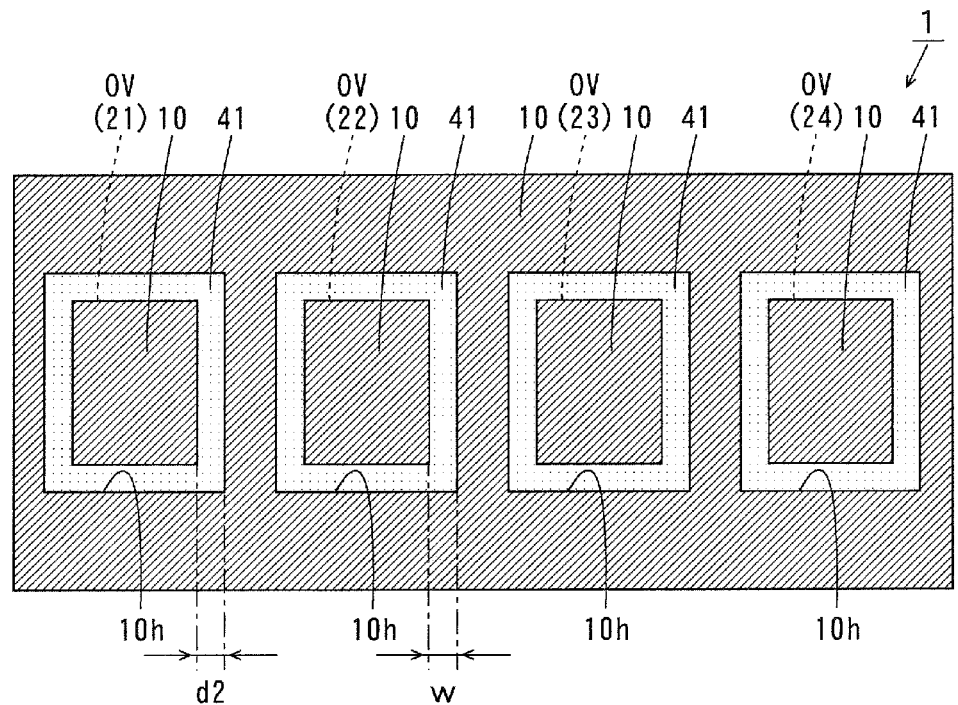
FIG. 8 is an enlarged bottom view showing the connection terminals of the suspension board and their peripheral portions according to a second embodiment.

FIG. 8 is an enlarged bottom view showing the connection terminals 21 to 24 of the suspension board 1 and their peripheral portions according to the second embodiment. The same hatched and dotted patterns applied to each member of the cross sectional views of FIGS. 5(a) to 5(c) and 6(a) to 6(d) are applied to the suspension board 1 of FIG. 8 in order to facilitate understanding of the configuration. As for the suspension board 1 according to the present embodiment, difference from the suspension board 1 according to the first embodiment will be described.

As shown in FIG. 8, in the suspension board 1 according to the present embodiment, each overlap region OV of the support substrate 10 is not removed, and the surrounding region of the overlap region OV is removed. This causes each opening 10h to be formed to surround the overlap region OV. The opening 10h is constituted by slits with a constant width that surrounds four sides of the overlap region OV. Parts of the insulating layer 41 are exposed in the openings 10h. Hereinafter, the width of each slit is referred to as a slit width w.

In such a manner, in the suspension board 1 according to the present embodiment, the opening 10h is formed in the support substrate 10 such that the inner periphery of the opening 10h coincides with the outer periphery of the overlap region OV and the outer periphery of the opening 10h is positioned outside of the outer periphery of the overlap region OV. In this case, an amount of heat that spreads from the portions of the insulating layer 41 overlapping with the connection terminals 21 to 24 to surroundings of the overlap regions OV of the support substrate 10 is sufficiently reduced. As a result, the temperature of the connection terminals 21 to 24 can be sufficiently retained.

Further, the slit width w of the opening 10h is preferably not less than 25 μm. In this case, heat transmission, from the portions of the insulating layer 41 that overlap with the connection terminals 21 to 24 to at least the regions of the outer peripheries of the overlap regions OV of the support substrate 10, is prevented. This causes an amount of heat dissipation from the overlap regions OV of the support substrate 10 to outside to be reduced and an amount of heat that spreads from the overlap regions OV of the support substrate 10 to surroundings of the overlap regions OV to be sufficiently reduced. The slit width w of the opening 10h is preferably not less than 30 μm and more preferably not less than 40 μm.

Except for the configuration of the opening 10h, the manufacturing method of the suspension board 1 according to the present embodiment is similar to the manufacturing method of the suspension board 1 according to the first embodiment.

[3] Third Embodiment

Figure 9:
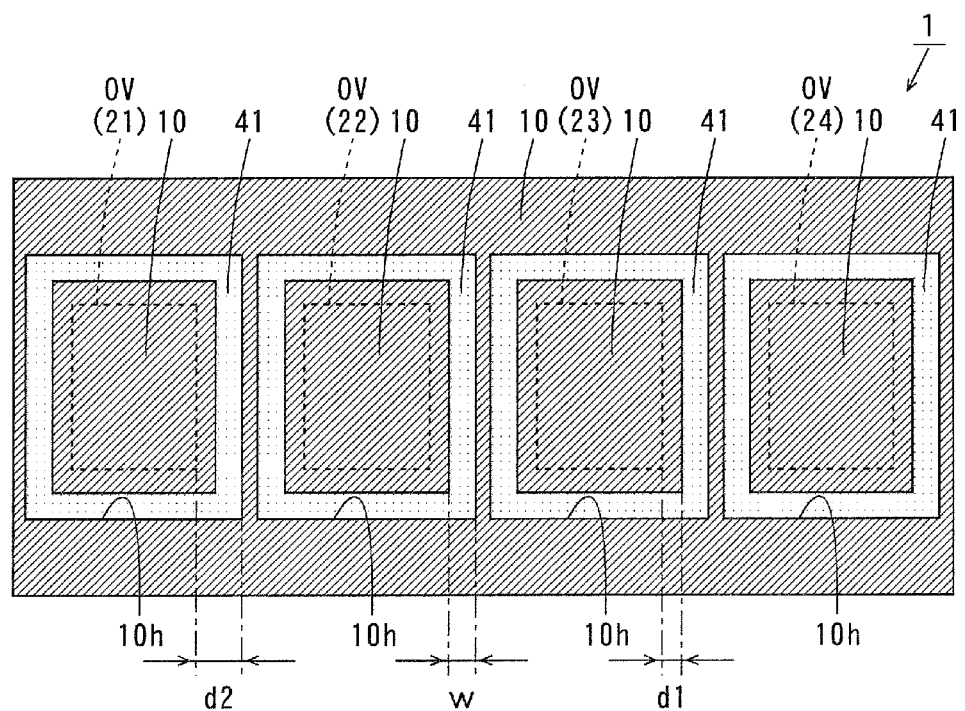
FIG. 9 is an enlarged bottom view showing the connection terminals of the suspension board and their peripheral portions according to a third embodiment.

FIG. 9 is an enlarged bottom view showing the connection terminals 21 to 24 of the suspension board 1 and their peripheral portions according to the third embodiment. The same hatched and dotted patterns applied to each member of the cross sectional views of FIGS. 5(a) to 5(c) and 6(a) to 6(d) are applied to the suspension board 1 of FIG. 9 in order to facilitate understanding of the configuration. As for the suspension board 1 according to the present embodiment, difference from the suspension board 1 according to the second embodiment will be described.

As shown in FIG. 9, in the suspension board 1 according to the present embodiment, regions a constant width apart from the overlap regions OV of the support substrate 10 and their peripheries are not removed, but regions with a constant width that surround these regions are removed. This causes each opening 10h to be formed to surround a region a constant width apart from each overlap region OV and its periphery. The opening 10h is constituted by slits with a constant width that surrounds four sides of the overlap region OV. Parts of the insulating layer 41 are exposed in the openings 10h.

Hereinafter, a distance from the outer periphery of the overlap region OV to the inner periphery of each opening 10h is referred to as an inner peripheral offset d1. In this case, the each slit w is the difference between the outer peripheral offset d2 and the inner peripheral offset d1.

Accordingly, in the suspension board 1 according to the present embodiment, the opening 10h is formed in the support substrate 10 such that the inner periphery of the opening 10h is positioned outside of the outer periphery of the overlap region OV. In this case, an amount of heat that spreads from the portions of the insulating layer 41 that overlap with the connection terminals 21 to 24 to the entire support substrate 10 is sufficiently reduced. As a result, the temperature of the connection terminals 21 to 24 can be sufficiently retained.

The inner peripheral offset d1 is preferably not more than 50 μm. In this case, an amount of heat that spreads from the portions of the insulating layer 41 that overlap with the connection terminals 21 to 24 to the entire support substrate 10 is reduced. As a result, the temperature of the connection terminals 21 to 24 can be sufficiently retained. The inner peripheral offset d1 is preferably not more than 20 μm.

Further, the outer peripheral offset d2 is preferably not less than 5 μm. In this case, an amount of heat that spreads from the portions of the insulating layer 41 that overlap with the connection terminals 21 to 24 to surroundings of the overlap regions OV of the support substrate 10 is sufficiently reduced. The outer peripheral offset d2 is preferably not less than 20 μm and more preferably not less than 25 μm.

The inner peripheral offset d1 may be a negative value, that is, the openings 10h may be formed in the support substrate 10 such that the inner periphery of the opening 10h is positioned inside of the outer periphery of each overlap region OV. In this case, heat transmission from the portions of the insulating layer 41 that overlap with the connection terminals 21 to 24 to at least the regions of the outer periphery of the overlap regions OV of the support substrate 10 is prevented, and an amount of heat that spreads from the overlap regions OV of the support substrate 10 to their surroundings is sufficiently reduced. As a result, the temperature of the connection terminals 21 to 24 can be sufficiently retained.

Note that, in the suspension board 1 according to the second embodiment of FIG. 8, the outer periphery of each overlap region OV and the inner periphery of the opening 10h coincide with each other. Therefore, the inner peripheral offset d1 is 0 μm.

[4] Fourth Embodiment

Figure 10:
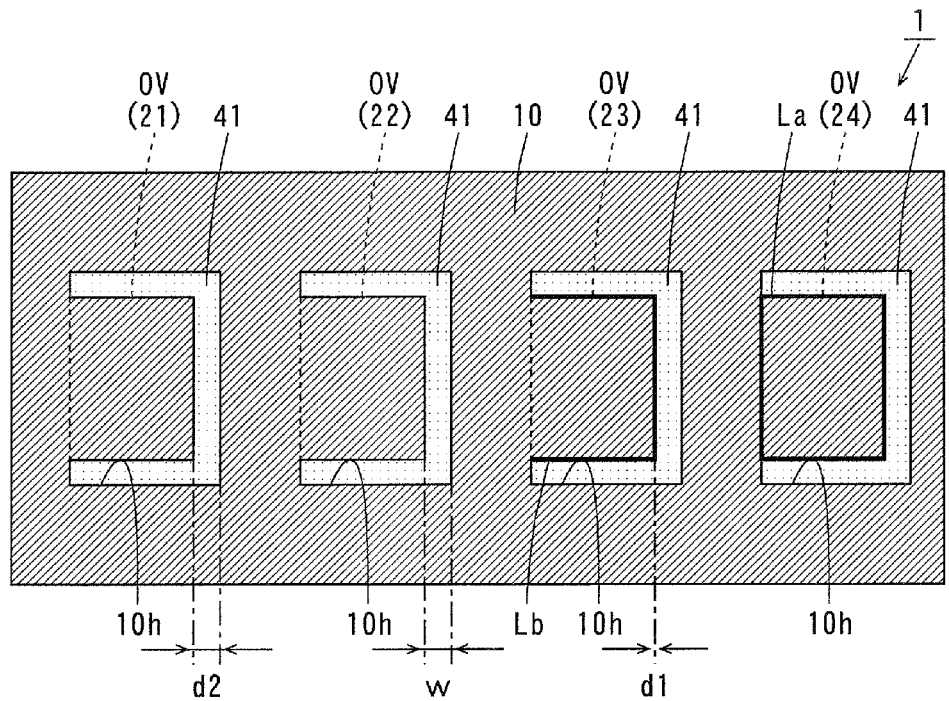
FIGS. 10(a) and 10(b) are enlarged bottom views showing the connection terminals of the suspension board and their peripheral portions according to a fourth embodiment.
Figure 10:
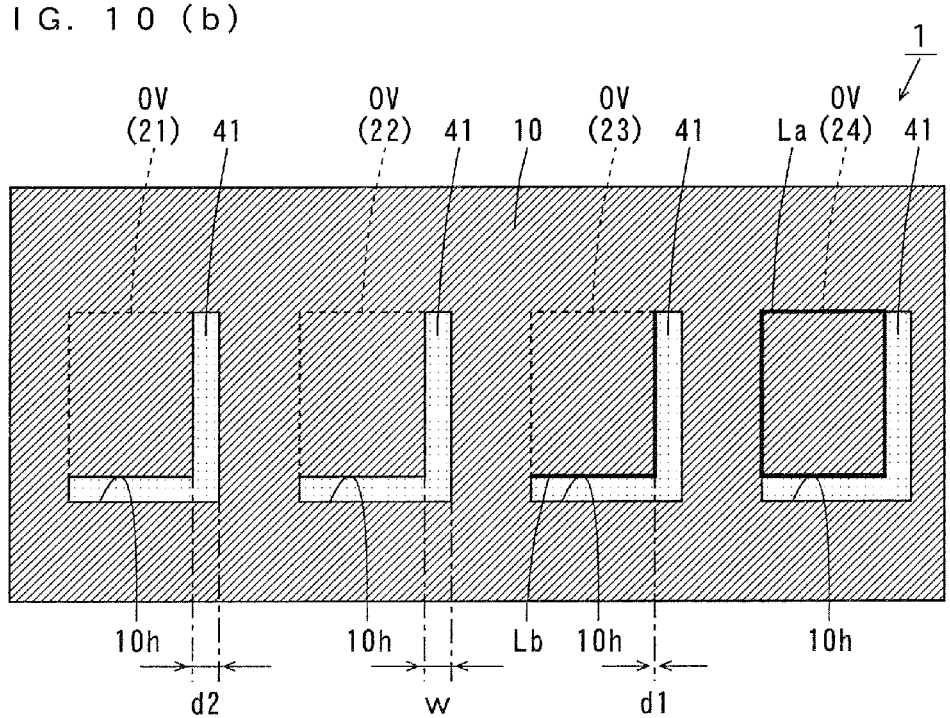

FIGS. 10(a) and 10(b) are enlarged bottom views showing the connection terminals 21 to 24 of the suspension board 1 and their peripheral portions according to the fourth embodiment. The same hatched and dotted patterns applied to each member of the cross sectional views of FIGS. 5(a) to 5(c) and 6(a) to 6(d) are applied to the suspension board 1 of FIGS. 10(a) and 10(b) in order to facilitate understanding of the configuration. As for the suspension board 1 according to the present embodiment, difference from the suspension board 1 according to the third embodiment will be described.

As shown in FIGS. 10(a) and 10(b), in the suspension board 1 according to the present embodiment, the overlap regions OV of the support substrate 10 are not removed, and parts of regions that surround the overlap regions OV are removed. This causes each opening 10h to be formed to surround part of each overlap region OV. The opening 10h is constituted by slits with a constant width that surround four sides of the overlap region OV. Parts of the insulating layer 41 are exposed in the openings 10h.

Hereinafter, the ratio of a length Lb of the overlap region OV surrounded by each opening 10h to an entire length La of the outer periphery of the overlap region OV (Lb/La) is referred to as circumference length ratio. In FIGS. 10(a) and 10(b), the entire length La and the length Lb of the outer periphery of the overlap region OV are indicated by the thick solid line. In the suspension board 1 of FIG. 10(a), the circumference length ratio of the opening 10h is about 75%. In the suspension board 1 of FIG. 10(b), the circumference length ratio of the opening 10h is about 50%. The circumference length ratio of the opening 10h is preferably not less than 50% and more preferably not less than 75%.

Accordingly, in the suspension board 1 according to the present embodiment, the opening 10h is formed so as to surround not less than 50% of the entire length La of the outer periphery of the overlap region OV. In this case, an amount of heat that spreads from the portions of the insulating layer 41 that overlap with the connection terminals 21 to 24 to the entire support substrate 10 is sufficiently reduced. As a result, the temperature of the connection terminals 21 to 24 can be sufficiently retained. The opening 10h is more preferably formed so as to surround not less than 75% of the entire length La of the outer periphery of the overlap region OV.

Note that, in the suspension board 1 according to the second embodiment of FIG. 8, the length of the outer periphery of the overlap region OV and the length of the inner periphery of the opening 10h are the same. Therefore, the circumference length ratio of the opening 10h is 100%. Similarly, in the suspension board 1 according to the third embodiment of FIG. 9, the circumference length ratio of the opening 10h is 100%.

[5] Other Embodiments (1) While the connection terminals 21 to 24, 31 to 34 are rectangular in the embodiments described above, the invention is not limited to this. The connection terminals 21 to 24, 31 to 34 may be circular, elliptical, triangular or another polygonal shape.

(2) In the embodiments described above, the openings 10*h* may be formed in the regions of the support substrate 10 that overlap with the connection terminals 31 to 34 and their surrounding regions of the support substrate 10.

[6] Correspondences between Elements in the Claims and Parts in Embodiments

In the following paragraphs, non-limiting examples of correspondences between various elements recited in the claims below and those described above with respect to various preferred embodiments of the present invention are explained.

In the embodiments described above, the suspension board 1 is an example of a printed circuit board, the support substrate 10 is an example of a support substrate, the insulating layer 41 is an example of an insulating layer, the read wiring traces R1, R2 or the write wiring traces W1, W2 are examples of a wiring trace. The connection terminals 21 to 24 are examples of a connection terminal, the overlap region OV is an example of an overlap region and the opening 10*h* is an example of an opening.

As each of various elements recited in the claims, various other elements having configurations or functions described in the claims can be also used.

[7] Inventive Examples

As for the suspension board 1 of the inventive examples 1 to 10 and the comparative examples 1, 2 described below, a time period from the time when the connection terminals 21 to 24 are heated to 1700° C. to the time when the temperature drops to a predetermined temperature (280° C. in this example) (hereinafter referred to as temperature-retention time) was evaluated by simulation.

Figure 11:
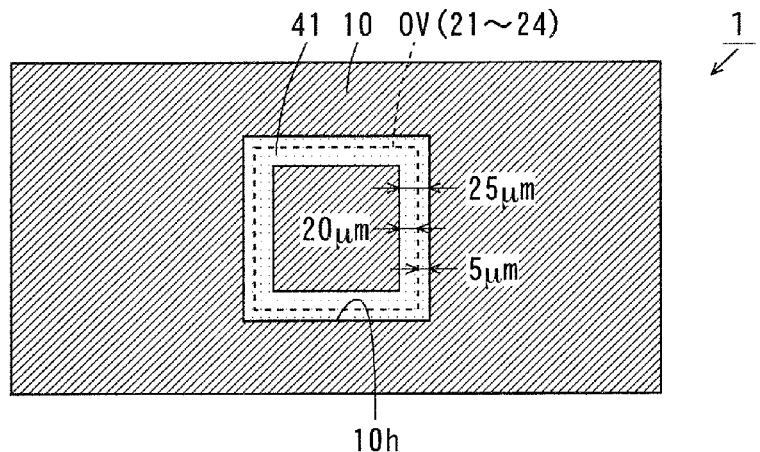
FIGS. 11(a) to 11(c) are enlarged bottom views showing one of the connection terminals of each suspension board and its peripheral portions according to inventive examples and comparative examples.
Figure 11:
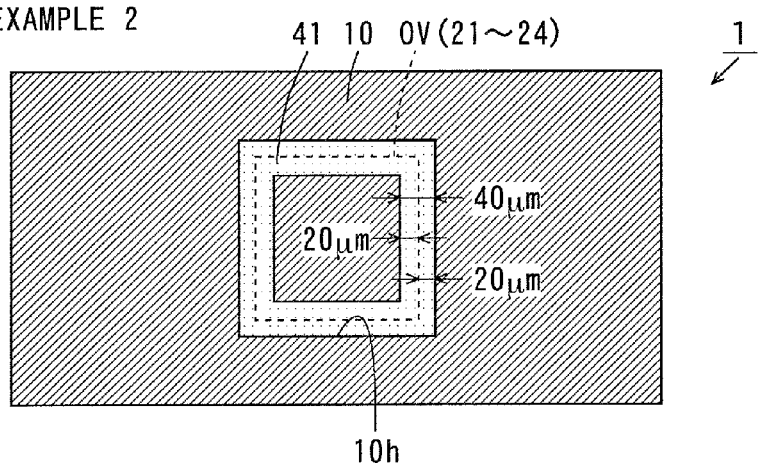
Figure 11:
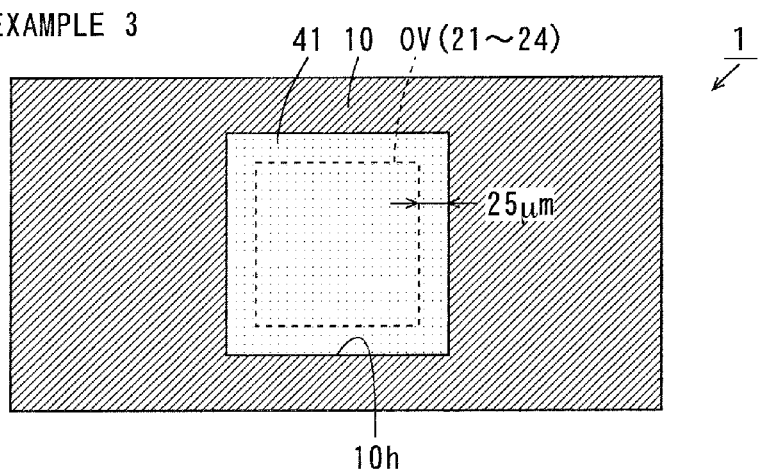

FIGS. 11(*a*) to 14(*c*) are enlarged bottom views showing the connection terminals 21 to 24 of the suspension board 1 and its peripheral portions according to the inventive examples 1 to 10 and the comparative examples 1, 2. The same hatched and dotted patterns applied to each member of the cross sectional views of FIGS. 5(*a*) to 5(*c*) and 6(*a*) to 6(*d*) are applied to the suspension board 1 of FIGS. 11(*a*) to 14(*c*) in order to facilitate understanding of the configuration.

FIG. 11(*a*) shows the suspension board 1 according to the inventive example 1. As shown in FIG. 11(*a*), in the suspension board 1 of the inventive example 1, the slit width w of the opening 10*h* is 25 μm, the inner peripheral offset d1 is −20 μm and the outer peripheral offset d2 is 5 μm. The circumference length ratio of the opening 10*h* is 100%.

FIG. 11(*b*) shows the suspension board 1 according to the inventive example 2. As shown in FIG. 11(*b*), in the suspension board 1 of the inventive example 2, the slit width w of the opening 10*h* is 40 μm, the inner peripheral offset d1 is −20 μm and the outer peripheral offset d2 is 20 μm. The circumference length ratio of the opening 10*h* is 100%.

FIG. 11(*c*) shows the suspension board 1 according to the inventive example 3. As shown in FIG. 11(*c*), in the suspension board 1 of the inventive example 3, the outer peripheral offset d2 is 25 μm. The circumference length ratio of the opening 10*h* is 100%. Each opening 10*h* is formed over each entire overlap region OV.

Figure 12:
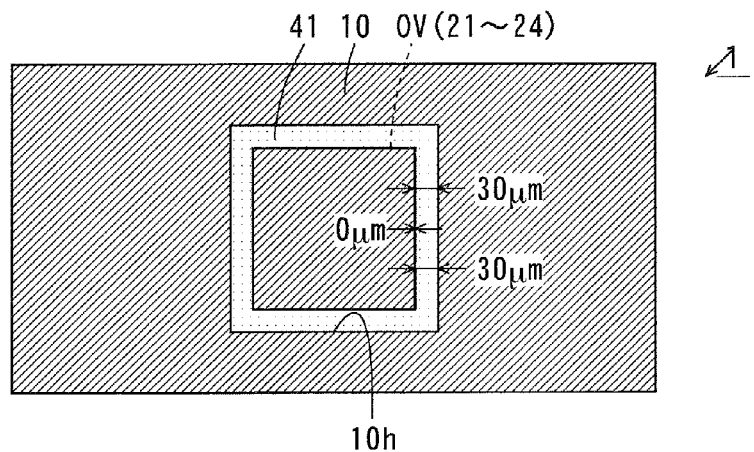
FIGS. 12(a) to 12(c) are enlarged bottom views showing one of the connection terminals of each suspension board and its peripheral portion according to the inventive examples and the comparative examples.
Figure 12:
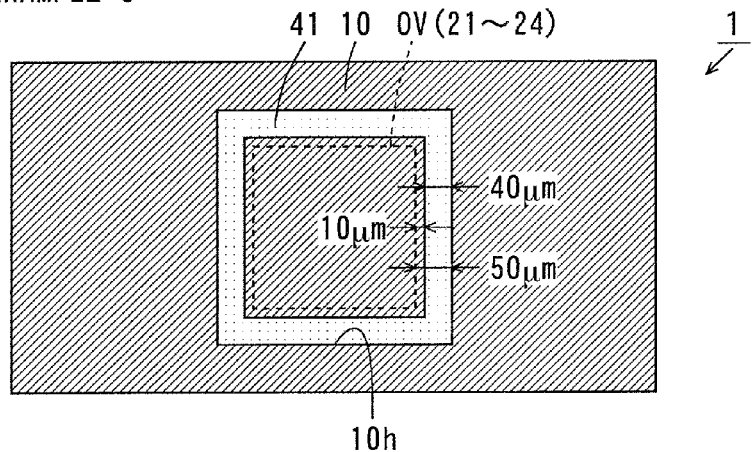
Figure 12:
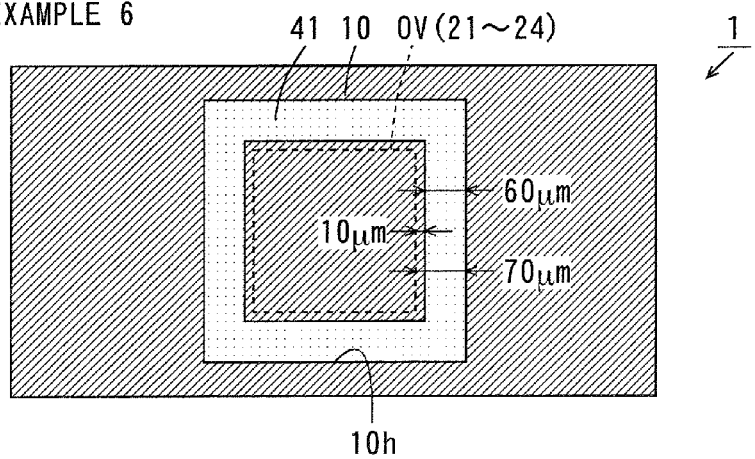

FIG. 12(*a*) shows the suspension board 1 according to the inventive example 4. As shown in FIG. 12(*a*), in the suspension board 1 of the inventive example 4, the slit width w of the opening 10*h* is 30 μm, the inner peripheral offset d1 is 0 μm and the outer peripheral offset d2 is 30 μm. The circumference length ratio of the opening 10*h* is 100%.

FIG. 12(*b*) shows the suspension board 1 according to the inventive example 5. As shown in FIG. 12(*b*), in the suspension board 1 of the inventive example 5, the slit width w of the opening 10*h* is 40 μm, the inner peripheral offset d1 is 10 μm and the outer peripheral offset d2 is 50 μm. The circumference length ratio of the opening 10*h* is 100%.

FIG. 12(*c*) shows the suspension board 1 according to the inventive example 6. As shown in FIG. 12(*c*), in the suspension board 1 of the inventive example 6, the slit width w of the opening 10*h* is 60 μm, the inner peripheral offset d1 is 10 μm and the outer peripheral offset d2 is 70 μm. The circumference length ratio of the opening 10*h* is 100%.

Figure 13:
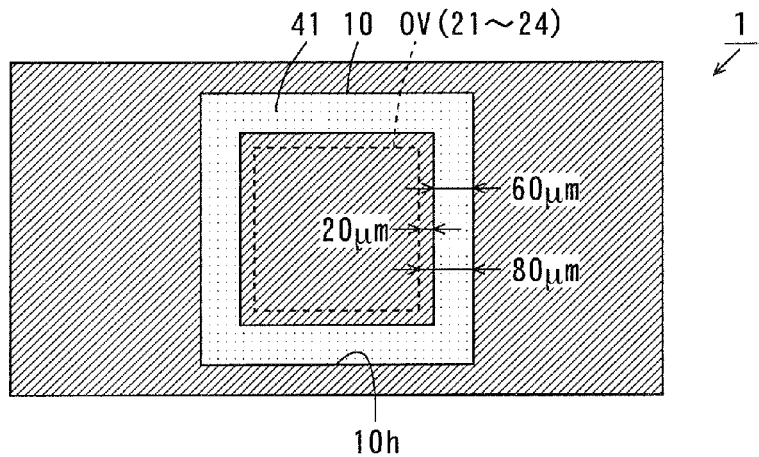
FIGS. 13(a) to 13(c) are enlarged bottom views showing one of the connection terminals of each suspension board and its peripheral portion according to the inventive examples and the comparative examples.
Figure 13:
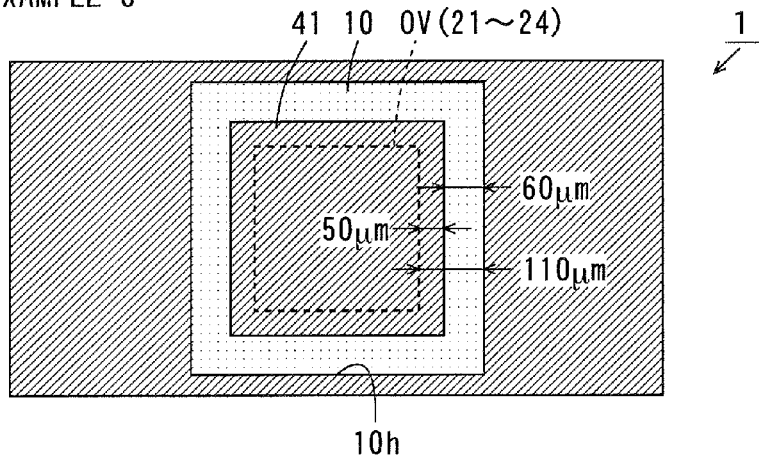
Figure 13:
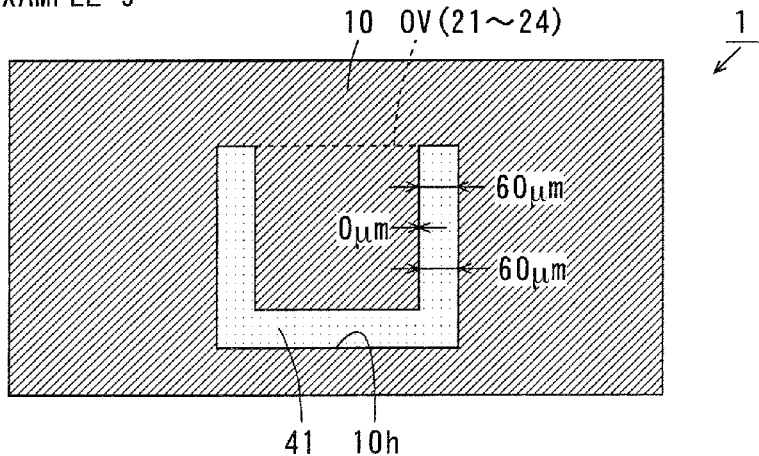

FIG. 13(*a*) shows the suspension board 1 according to the inventive example 7. As shown in FIG. 13(*a*), in the suspension board 1 of the inventive example 7, the slit width w of the opening 10*h* is 60 μm, the inner peripheral offset d1 is 20 μm and the outer peripheral offset d2 is 80 μm. The circumference length ratio of the opening 10*h* is 100%.

FIG. 13(*b*) shows the suspension board 1 according to the inventive example 8. As shown in FIG. 13(*b*), in the suspension board 1 of the inventive example 8, the slit width w of the opening 10*h* is 60 μm, the inner peripheral offset d1 is 50 μm and the outer peripheral offset d2 is 110 μm. The circumference length ratio of the opening 10*h* is 100%.

FIG. 13(*c*) shows the suspension board 1 according to the inventive example 9. As shown in FIG. 13(*c*), in the suspension board 1 of the inventive example 9, the slit width w of the opening 10*h* is 60 μm, the inner peripheral offset d1 is 0 μm and the outer peripheral offset d2 is 60 μm. The circumference length ratio of the opening 10*h* is 75%.

Figure 14:
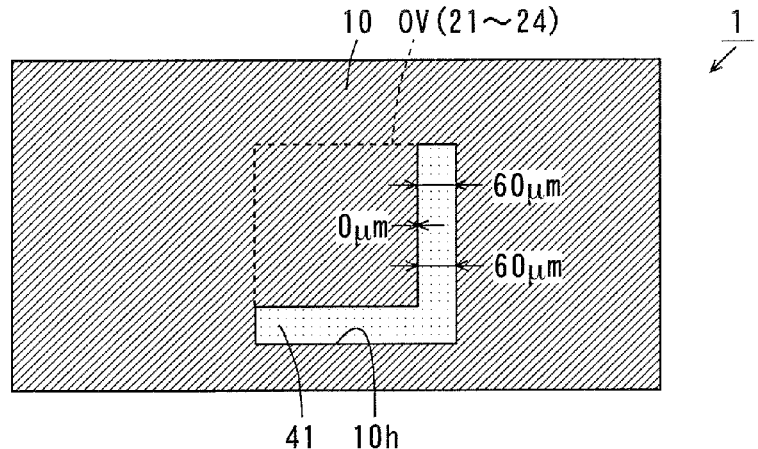
FIGS. 14(a) to 14(c) are enlarged bottom views showing one of the connection terminals of each suspension board and its peripheral portion according to the inventive examples and the comparative examples.
Figure 14:
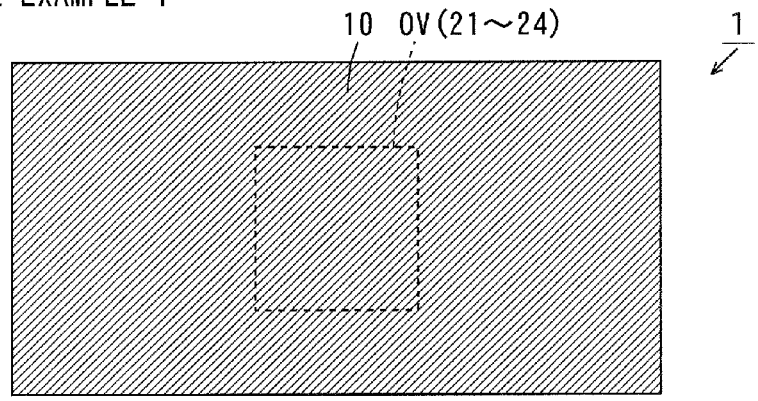
Figure 14:
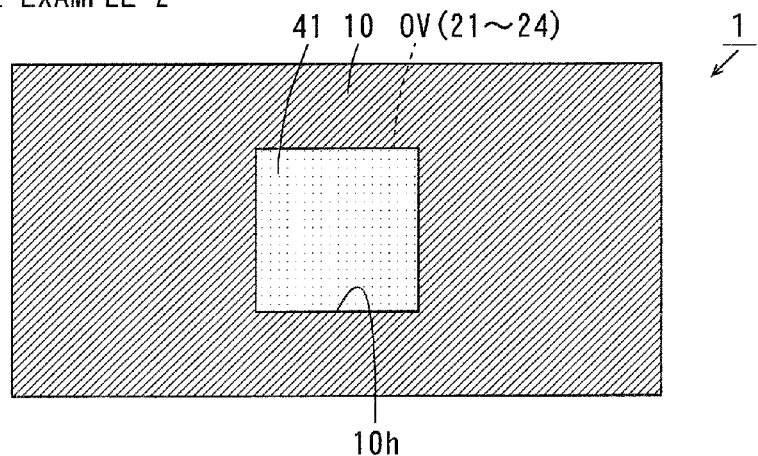

FIG. 14(*a*) shows the suspension board 1 according to the inventive example 10. As shown in FIG. 14(*a*), in the suspension board 1 of the inventive example 10, the slit width w of the opening 10*h* is 60 μm, the inner peripheral offset d1 is 0 μm and the outer peripheral offset d2 is 60 μm. The circumference length ratio of the opening 10*h* is 50%.

FIG. 14(*b*) shows the suspension board 1 according to the comparative example 1. As shown in FIG. 14(*b*), in the suspension board 1 of the comparative example 1, the opening 10*h* is not formed in the support substrate 10.

FIG. 14(*c*) shows the suspension board 1 according to the comparative example 2. As shown in FIG. 14(*c*), in the suspension board 1 of the comparative example 2, each overlap region OV is removed, whereby the opening 10*h* is formed in the overlap region OV. The opening 10*h* is not formed in the region outside of the overlap region OV.

The simulation results of the temperature-retention time regarding the connection terminals 21 to 24 of the inventive examples 1 to 10 and the comparative examples 1, 2 are shown in Table 1. In Table 1, when the temperature-retention time of the connection terminals 21 to 24 is not more than 1.750 ms, "x" is shown to indicate that the temperature was not retained. When the temperature-retention time of the connection terminals 21 to 24 is more than 1.750 ms, "◯" is shown to indicate that the temperature was retained. When the temperature-retention time of the connection terminals 21 to 24 is more than 1.812 ms, "⊚" is shown to indicate that the temperature was particularly well retained.

TABLE 1

| | SLIT WIDTH | INNER PERIPHERAL OFFSET | OUTER PERIPHERAL OFFSET | CIRCUMFERENCE LENGTH RATIO | TEMPERATURE RETENTION TIME | TEMPERATURE RETENTION EFFECT |
|---|---|---|---|---|---|---|
| INVENTIVE EXAMPLE 1 | 25 μm | −20 μm | 5 μm | 100% | 1.756 ms | ◯ |
| INVENTIVE EXAMPLE 2 | 40 μm | −20 μm | 20 μm | 100% | 1.854 ms | ◎ |
| INVENTIVE EXAMPLE 3 | — | — | 25 μm | 100% | 1.954 ms | ◎ |
| INVENTIVE EXAMPLE 4 | 30 μm | 0 μm | 30 μm | 100% | 1.812 ms | ◯ |
| INVENTIVE EXAMPLE 5 | 40 μm | 10 μm | 50 μm | 100% | 1.846 ms | ◎ |
| INVENTIVE EXAMPLE 6 | 60 μm | 10 μm | 70 μm | 100% | 1.940 ms | ◎ |
| INVENTIVE EXAMPLE 7 | 60 μm | 20 μm | 80 μm | 100% | 1.864 ms | ◎ |
| INVENTIVE EXAMPLE 8 | 60 μm | 50 μm | 110 μm | 100% | 1.786 ms | ◯ |
| INVENTIVE EXAMPLE 9 | 60 μm | 0 μm | 60 μm | 75% | 1.860 ms | ◎ |
| INVENTIVE EXAMPLE 10 | 60 μm | 0 μm | 60 μm | 50% | 1.780 ms | ◯ |
| COMPARATIVE EXAMPLE 1 | 0 μm | 0 μm | — | — | 1.728 ms | X |
| COMPARATIVE EXAMPLE 2 | 0 μm | — | 0 μm | — | 1.750 ms | X |

As shown in Table 1, in the suspension board 1 according to the inventive example 1, the temperature-retention time was 1.756 ms, and the temperature was retained for the connection terminals 21 to 24. In the suspension board 1 according to the inventive example 2, the temperature-retention time was 1.854 ms, and the temperature was particularly well retained for the connection terminals 21 to 24. In the suspension board 1 according to the inventive example 3, the temperature-retention time was 1.954 ms, and the temperature was particularly well retained for the connection terminals 21 to 24.

In the suspension board 1 according to the inventive example 4, the temperature-retention time was 1.812 ms, and the temperature was retained for the connection terminals 21 to 24. In the suspension board 1 according to the inventive example 5, the temperature-retention time was 1.846 ms, and the temperature was particularly well retained for the connection terminals 21 to 24. In the suspension board 1 according to the inventive example 6, the temperature-retention time was 1.940 ms, and the temperature was particularly well retained for the connection terminals 21 to 24. In the suspension board 1 according to the inventive example 7, the temperature-retention time was 1.864 ms, and the temperature was particularly well retained for the connection terminals 21 to 24.

In the suspension board 1 according to the inventive example 8, the temperature-retention time was 1.786 ms, and the temperature was retained for the connection terminals 21 to 24. In the suspension board 1 according to the inventive example 9, the temperature-retention time was 1.860 ms, and the temperature was particularly well retained for the connection terminals 21 to 24. In the suspension board 1 according to the inventive example 10, the temperature-retention time was 1.780 ms, and the temperature was retained for the connection terminals 21 to 24.

On the other hand, in the suspension board 1 according to the comparative example 1, the temperature-retention time was 1.728 ms, and the temperature was not retained for the connection terminals 21 to 24. In the suspension board 1 according to the comparative example 2, the temperature-retention time was 1.750 ms, and the temperature was not retained for the connection terminals 21 to 24.

The result of comparison between the inventive examples 1 to 10 and the comparative examples 1, 2 showed that the temperature was retained for the connection terminals 21 to 24 by setting the outer peripheral offset d2 to not less than 5 μm. Similarly, it was confirmed that the temperature was retained for the connection terminals 21 to 24 by setting the circumference length ratio to not less than 50%.

Further, the result of comparison between the inventive examples 1, 2, 4 to 10 and the comparative examples 1, 2 showed that the temperature was retained for the connection terminals 21 to 24 by setting the inner peripheral offset d1 to not more than 50 μm. Similarly, it was confirmed that the temperature was retained for the connection terminals 21 to 24 by setting the slit width w to not less than 25 μm.

Furthermore, the result of comparison between the inventive examples 1, 2 showed that the temperature was particularly well retained for the connection terminals 21 to 24 by setting the slit width w of the opening 10*h* to not less than 40 μm. The result of comparison between the inventive examples 7, 8 showed that the temperature was particularly well retained for the connection terminals 21 to 24 by setting the inner peripheral offset d1 of the opening 10*h* to not more than 20 μm. The result of comparison between the inventive examples 9, 10 showed that the temperature was particularly well retained for the connection terminals 21 to 24 by setting the circumference length ratio of the opening 10*h* to not less than 75%.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board that is electrically connectable to an external circuit, the printed circuit board comprising:
   a support substrate formed of a conductive material;
   an insulating layer formed on the support substrate;

a wiring trace formed on the insulating layer; and
a connection terminal formed at part of the wiring trace on the insulating layer and being electrically connectable to the external circuit,
wherein the support substrate has an overlap region that overlaps with the connection terminal and has the same plane shape as the connection terminal,
wherein an opening is present in the support substrate so as to partially or entirely surround the overlap region of the support substrate, part of the insulating layer being exposed in the opening,
wherein the opening has an outer periphery that is positioned outside of an outer periphery of the overlap region and an inner periphery that is positioned inside of the outer periphery of the overlap region, a distance between the outer periphery of the opening and the outer periphery of the overlap region being not less than 5 μm, and a width between the inner periphery of the opening and the outer periphery of the opening being not less than 25 μm.

2. The printed circuit board according to claim 1, wherein a width between the inner periphery of the opening and the outer periphery of the opening is not less than 40 μm.

3. The printed circuit board according to claim 1, wherein the opening is formed so as to surround a portion that is not less than 50% in length of the outer periphery of the overlap region.

4. The printed circuit board according to claim 3, wherein the opening is formed so as to surround a portion that is not less than 75% in length of the outer periphery of the overlap region.

5. A printed circuit board that is electrically connectable to an external circuit, the printed circuit board comprising:
a support substrate formed of a conductive material;
an insulating layer formed on the support substrate;
a wiring trace formed on the insulating layer; and
a connection terminal formed at part of the wiring trace on the insulating layer and being electrically connectable to the external circuit,
wherein the support substrate has an overlap region that overlaps with the connection terminal and has the same plane shape as the connection terminal,
wherein an opening is present in the support substrate so as to partially or entirely surround the overlap region of the support substrate, part of the insulating layer being exposed in the opening, the opening having an outer periphery positioned outside of an outer periphery of the overlap region, a distance between the outer periphery of the opening and the outer periphery of the overlap region being not less than 25 μm, and
wherein the opening is formed so as to spread to an entire region of the overlap region.

6. The printed circuit board according to claim 5, wherein the opening is formed so as to surround a portion that is not less than 50% in length of the outer periphery of the overlap region.

7. The printed circuit board according to claim 6, wherein the opening is formed so as to surround a portion that is not less than 75% in length of the outer periphery of the overlap region.

8. A printed circuit board that is electrically connectable to an external circuit, the printed circuit board comprising:
a support substrate formed of a conductive material;
an insulating layer formed on the support substrate;
a wiring trace formed on the insulating layer; and
a connection terminal formed at part of the wiring trace on the insulating layer and being electrically connectable to the external circuit,
wherein the support substrate has an overlap region that overlaps with the connection terminal and has the same plane shape as the connection terminal,
wherein an opening is present in the support substrate so as to partially or entirely surround the overlap region of the support substrate, part of the insulating layer being exposed in the opening,
wherein the opening has an outer periphery that is positioned outside of an outer periphery of the overlap region and an inner periphery that coincides with the outer periphery of the overlap region or is positioned outside of the outer periphery of the overlap region, a distance between the outer periphery of the opening and the outer periphery of the overlap region being not less than 5 μm, and a distance between the outer periphery of the overlap region and the inner periphery of the opening is not more than 50 μm.

9. The printed circuit board according to claim 8, wherein a distance between the outer periphery of the overlap region and the inner periphery of the opening is not more than 20 μm.

10. The printed circuit board according to claim 8, wherein a width between the inner periphery of the opening and the outer periphery of the opening is not less than 25 μm.

11. The printed circuit board according to claim 10, wherein a width between the inner periphery of the opening and the outer periphery of the opening is not less than 30 μm.

12. The printed circuit board according to claim 11, wherein a width between the inner periphery of the opening and the outer periphery of the opening is not less than 40 μm.

13. The printed circuit board according to claim 8, wherein the opening is formed so as to surround a portion that is not less than 50% in length of the outer periphery of the overlap region.

14. The printed circuit board according to claim 13, wherein the opening is formed so as to surround a portion that is not less than 75% in length of the outer periphery of the overlap region.

15. A method of manufacturing a printed circuit board that is electrically connectable to an external circuit, the method comprising the steps of:
preparing an insulating layer formed on a support substrate that is formed of conductive material;
forming a wiring trace having a connection terminal that is electrically connectable to the external circuit on the insulating layer; and
forming an opening in the support substrate,
wherein the support substrate has an overlap region that overlaps with the connection terminal and has the same plane shape as the connection terminal, the opening is formed in the support substrate so as to partially or entirely surround the overlap region, and part of the insulating layer is exposed in the opening, and
wherein the opening has an outer periphery positioned outside of an outer periphery of the overlap region and an inner periphery positioned inside of the outer periphery of the overlap region, a distance between the outer periphery of the opening and the outer periphery of the overlap region being not less than 5 μm and a width between the inner periphery of the opening and the outer periphery of the opening being not less than 25 μm.

16. A method of manufacturing a printed circuit board that is electrically connectable to an external circuit, the method comprising the steps of:
preparing an insulating layer formed on a support substrate that is formed of conductive material;
forming a wiring trace having a connection terminal that is electrically connectable to the external circuit on the insulating layer; and
forming an opening in the support substrate,
wherein the support substrate has an overlap region that overlaps with the connection terminal and has the same plane shape as the connection terminal, the opening being formed in the support substrate so as to partially or entirely surround the overlap region, part of the insulating layer being exposed in the opening, and
wherein the opening has an outer periphery positioned outside of an outer periphery of the overlap region, a distance between the outer periphery of the opening and the outer periphery of the overlap region being not less than 25 μm, the opening being formed so as to spread to an entire region of the overlap region.

17. A method of manufacturing a printed circuit board that is electrically connectable to an external circuit, the method comprising the steps of:
preparing an insulating layer formed on a support substrate that is formed of conductive material;
forming a wiring trace having a connection terminal that is electrically connectable to the external circuit on the insulating layer; and
forming an opening in the support substrate,
wherein the support substrate has an overlap region that overlaps with the connection terminal and has the same plane shape as the connection terminal, the opening being formed in the support substrate so as to partially or entirely surround the overlap region, part of the insulating layer being exposed in the opening, and
wherein the opening has an outer periphery positioned outside of an outer periphery of the overlap region and an inner periphery that coincides with the outer periphery of the overlap region or is positioned outside of the outer periphery of the overlap region, a distance between the outer periphery of the opening and the outer periphery of the overlap region being not less than 5 μm, and a distance between the outer periphery of the overlap region and the inner periphery of the opening is not more than 50 μm.

* * * * *